US012381065B2

(12) United States Patent
Valcore, Jr. et al.

(10) Patent No.: US 12,381,065 B2
(45) Date of Patent: *Aug. 5, 2025

(54) METHODS AND APPARATUS FOR CONTROLLING PLASMA IN A PLASMA PROCESSING SYSTEM

(71) Applicant: Lam Research Corporation, Fremont, CA (US)

(72) Inventors: John C. Valcore, Jr., Worthington, OH (US); Bradford J. Lyndaker, Lowville, NY (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/475,006

(22) Filed: Sep. 26, 2023

(65) Prior Publication Data

US 2024/0021408 A1 Jan. 18, 2024

Related U.S. Application Data

(60) Continuation of application No. 16/024,602, filed on Jun. 29, 2018, now Pat. No. 11,798,784, which is a
(Continued)

(51) Int. Cl.
*H01L 21/00* (2006.01)
*B44C 1/22* (2006.01)
(Continued)

(52) U.S. Cl.
CPC .......... *H01J 37/32091* (2013.01); *B44C 1/22* (2013.01); *H01J 37/32165* (2013.01);
(Continued)

(58) Field of Classification Search
None
See application file for complete search history.

(56) References Cited

U.S. PATENT DOCUMENTS

5,928,528 A * 7/1999 Kubota ............. H01J 37/32706
257/E21.252
8,110,991 B2 * 2/2012 Coumou ........... H01J 37/32082
315/111.41
(Continued)

*Primary Examiner* — Parviz Hassanzadeh
*Assistant Examiner* — Michelle Crowell
(74) *Attorney, Agent, or Firm* — PENILLA IP, APC (57) ABSTRACT

Methods and apparatus for processing a substrate in a multi-frequency plasma processing chamber are disclosed. The base RF signal pulses between a high power level and a low power level. Each of the non-base RF generators, responsive to a control signal, proactively switches between a first predefined power level and a second predefined power level as the base RF signal pulses. Alternatively or additionally, each of the non-base RF generators, responsive to a control signal, proactively switches between a first predefined RF frequency and a second predefined RF frequency as the base RF signal pulses. Techniques are disclosed for ascertaining in advance of production time the first and second predefined power levels and/or the first and second predefined RF frequencies for the non-base RF signals.

7 Claims, 9 Drawing Sheets

Related U.S. Application Data division of application No. 14/792,527, filed on Jul. 6, 2015, now Pat. No. 10,032,605, which is a continuation of application No. 13/531,491, filed on Jun. 22, 2012, now Pat. No. 9,114,666.

(60) Provisional application No. 61/602,040, filed on Feb. 22, 2012, provisional application No. 61/602,041, filed on Feb. 22, 2012.

(51) Int. Cl.
  *H01J 37/32* (2006.01)
  *H03L 5/00* (2006.01)

(52) U.S. Cl.
  CPC .......... *H01J 37/32935* (2013.01); *H03L 5/00* (2013.01); *H05H 2242/26* (2021.05)

(56) References Cited

U.S. PATENT DOCUMENTS

| | | | | |
|---|---|---|---|---|
| 2002/0139658 | A1* | 10/2002 | Kanakasabapathy | H01J 37/32422 204/164 |
| 2004/0221958 | A1* | 11/2004 | Loewenhardt | H01J 37/32137 156/345.47 |
| 2009/0294061 | A1* | 12/2009 | Shannon | H01J 37/32183 118/723 MP |
| 2009/0294062 | A1* | 12/2009 | Shannon | H01J 37/32091 156/345.24 |
| 2009/0294414 | A1* | 12/2009 | Shannon | H01J 37/32935 219/121.54 |
| 2009/0298287 | A1* | 12/2009 | Shannon | H01J 37/32091 438/758 |
| 2010/0099266 | A1* | 4/2010 | Oswald | H01J 37/32045 438/719 |
| 2010/0130018 | A1* | 5/2010 | Tokashiki | H01J 37/32174 156/345.48 |
| 2010/0190350 | A1* | 7/2010 | Yatsuda | H01J 37/32146 156/345.28 |
| 2011/0030216 | A1* | 2/2011 | Kobayashi | B41J 2/17563 29/890.1 |
| 2013/0009545 | A1* | 1/2013 | Benjamin | H01J 37/32146 315/111.21 |

\* cited by examiner

METHODS AND APPARATUS FOR CONTROLLING PLASMA IN A PLASMA PROCESSING SYSTEM

CLAIM OF PRIORITY

This application is a continuation of and claims the benefit, under 35 U.S.C. § 120, of U.S. patent application Ser. No. 16/024,602, filed on Jun. 29, 2018, and titled "METHODS AND APPARATUS FOR CONTROLLING PLASMA IN A PLASMA PROCESSING SYSTEM", which is a divisional of and claims the benefit, under 35 U.S.C. § 120, of U.S. patent application Ser. No. 14/792,527, filed on Jul. 6, 2015, titled "METHODS AND APPARATUS FOR CONTROLLING PLASMA IN A PLASMA PROCESSING SYSTEM", and now issued as U.S. Pat. No. 10,032,605, which is a continuation of and claims the benefit, under 35 U.S.C. § 120, of U.S. patent application Ser. No. 13/531,491, filed on Jun. 22, 2012, and titled "METHODS AND APPARATUS FOR CONTROLLING PLASMA IN A PLASMA PROCESSING SYSTEM", and now issued as U.S. Pat. No. 9,114,666, which claims the benefit of and priority, under 35 U.S.C. § 119(e), to U.S. Provisional Patent Application No. 61/602,040, filed on Feb. 22, 2012, and titled "FREQUENCY ENHANCED IMPEDANCE DEPENDENT POWER CONTROL FOR MULTI-FREQUENCY RF PULSING", and to U.S. Provisional Patent Application No. 61/602,041, filed on Feb. 22, 2012, and titled "METHODS AND APPARATUS FOR SYNCHRONIZING RF PULSES IN A PLASMA PROCESSING SYSTEM", all of which are incorporated by reference herein in their entirety.

BACKGROUND

Plasma processing has long been employed to process substrates (e.g., wafer or flat panels or other substrates) to create electronic devices (e.g., integrated circuits or flat panel displays). In plasma processing, a substrate is disposed in a plasma processing chamber, which employs one or more electrodes to excite a source gas (which may be an etchant source gas or a deposition source gas) to form a plasma for processing the substrate. The electrode may be excited by an RF signal, which is furnished by an RF generator, for example.

In some plasma processing systems, multiple RF signals, some of which may have the same or different RF frequencies, may be provided to the substrate-bearing electrode (also referred to herein as the lower electrode or chuck) to generate plasma while the upper electrode is grounded. In a capacitively-coupled plasma processing system, for example, one or more RF signals may be provided to the bottom electrode while the top electrode is grounded.

In some applications, the plurality of RF signals may be pulsed. For any given RF signal, RF pulsing involves turning the RF signal on and off (or alternating between a high power level and a low power level since pulsing does not always require the power to be turned off) at a pulsing frequency that may be different from (and typically slower than) the RF frequency. Generally speaking, RF pulsing is performed in the past to improve certain processing results (such as to improve uniformity or reduce etching-related damage).

The pulsing of the various RF signals may be unsynchronized or synchronized. With respect to synchronized pulsing, for example, if two signals RF1 and RF2 are synchronized, there is an active pulse of signal RF1 for every active pulse of signal RF2. The pulses of the two RF signals may be in phase, or the leading edge of one RF pulse may lag behind the leading edge of the other RF pulse, or the trailing edge of one RF pulse may lag behind the trailing edge of the other RF pulse, or the RF pulses may be out of phase.

If the pulsing of the various RF signals is not well-controlled, there is a risk that RF power instability resulting in plasma perturbation may occur during the transition from low to high (or vice versa) of one or more of the RF signals. This is because during such a transition by one or more of the RF signals, the plasma condition in the processing chamber changes. Such change may be detected by the match network and/or the other RF generators, which may attempt to compensate for the detected plasma condition changes. The reactive nature of such compensation means that for the duration between a plasma condition change detection and successful compensation, RF power perturbations resulting in plasma instability exist.

Figure 1:
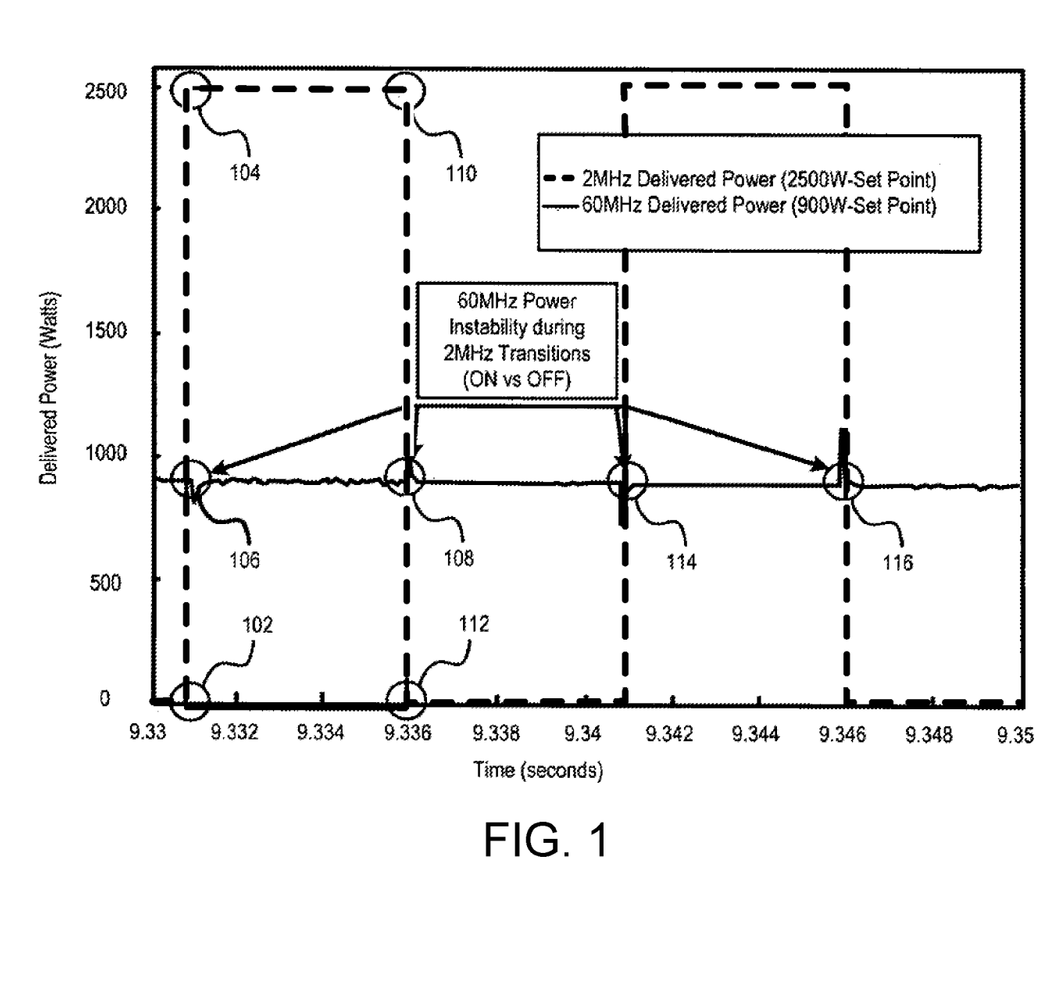
FIG. 1 shows an example of such RF power perturbation, which may result in plasma instability during the transition of one of the pulsing RF signals.

FIG. 1 shows an example of such RF power perturbation, which may result in plasma instability during the transition of one of the pulsing RF signals. In the example of FIG. 1, the 2 MHz RF signal pulses at 100 Hz with a 50% duty cycle between 2,500 W and 0 W. For illustration purposes, suppose the 60 MHz RF signal operates in the continuous waveform (CW) mode without pulsing. As the 2 MHz RF signal transitions from the low state 102 to the high state 104, the plasma condition within the chamber changes in response to the changing power supplied. The 60 MHz RF signal, upon detecting such plasma condition change, is shown compensating (either via the compensation circuit in the 60 MHz RF power supply or in the match network) for the detected plasma condition change.

However, this is a reactive response and depends on first detecting the plasma condition change brought about by the low-to-high transition of the 2 MHz pulsing RF signal (which pulses at a pulsing frequency of 100 Hz as mentioned earlier). The delay and subsequent response causes the RF power level perturbation shown by reference number 106, which shows a temporary dip in the power level of the 60 MHz RF signal after the 2 MHz transitions from low to high. Another instance of RF power level perturbation in the 60 MHz RF signal due to the delayed response of the 60 MHz RF signal is shown by reference number 108 after the 2 MHz RF transitions from high (110) to low (112). Other RF power perturbations are shown by reference numbers 114 and 116 in FIG. 1, for example. As can be seen in FIG. 1, these RF power perturbations may be in the positive direction or negative direction and may have different intensities. Such perturbations result in unstable and/or poorly controlled plasma events, affecting process results and/or device yield.

Furthermore, modern plasma processes impose stringent process result requirements in the fabrication of high density, high performance devices. Some process windows cannot be reached or are quite narrow with traditional constant waveform RF signals or with traditional RF pulsing methods.

Manipulating and further control of the pulsing of various RF signals to improve plasma stability and/or to provide additional process control knobs are among the many goals of embodiments of the present invention.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for controlling plasma processes by proactively setting the RF power levels of one or more higher frequency RF signals and proactively control the pulsing to minimize RF power perturbation during processing. The power levels of the higher frequency RF signals are determined and then set separately responsive to the pulsing state of the base pulsing RF signal. In other words, the power levels of the higher frequency RF signals are determined and then set separately for the high pulse of the base pulsing RF signal and for the low pulse of the base pulsing RF signal.

As the term is employed herein, the base pulsing RF signal represents the lowest frequency RF signal that pulses. For example, if the lower electrode is provided with three RF signals (2 MHz, 27 MHz, and 60 MHz) and the 2 MHz RF signal pulses, the 2 MHz RF signal represents the base pulsing RF signal since it is the lowest frequency RF signal that pulses. As another example, if a plasma processing chamber is provided with three RF signals to its lower electrode (2 MHz, 27 MHz, and 60 MHz) and the 2 MHz RF signal is operated in the continuous waveform (i.e., non pulsing mode) and the 27 MHz RF signal and the 60 MHz RF signal pulse, the 27 MHz RF signal represents the base pulsing RF signal.

To clarify terms, the base pulsing RF signal may be the same or may be different from a master RF signal, which represents the independently pulsing RF signal. When multiple RF power supplies pulse, one of the RF power supplies may be designated the master RF power supply and pulses its master RF signal independently. The master RF power supply may issue control signals to other RF power supplies to synchronize pulsing. There is no requirement that the master RF signal be the lowest frequency RF signal. Thus, the 27 MHz pulsing RF signal may act as a master for the 2 MHz pulsing RF signal, and vice versa. However, the base pulsing RF signal is, as the term is employed herein, the lowest frequency RF signal that pulses. It should be noted at this point that the use of a master RF power supply to synchronize pulsing among RF power supplies is only one way to synchronize pulsing. An external circuit may be employed to synchronize the pulsing among all RF power supplies, for example.

In one or more embodiments, as the base RF signal pulses, each of the other pulsing RF signals proactively alternates between its first preset power level and its second preset power level in synchronization with the pulsing states of the base pulsing RF signal. The first preset power level represents the other pulsing RF signal's power level that is established for the high pulse of the base RF signal. The second preset power level represents the other pulsing RF signal's power level that is established for the low pulse of the base RF signal.

For example, suppose a plasma processing chamber is provided with three RF signals to its lower electrode (2 MHz, 27 MHz, and 60 MHz) and both the 2 MHz and the 27 MHz RF signals pulse at 100 Hz. The 2 MHz base pulsing RF signal would pulse between a 2 MHz high power level and a 2 MHz low power level at 100 Hz. The 27 MHz RF signal would proactively, responsive to a control signal from a master RF power supply or an external synchronization control circuit, alternate between a first preset power level (which occurs responsive to the 2 MHz high power level) and the second preset power level (which occurs responsive to the 2 MHz low power level).

The preset power levels of the non-base pulsing RF signal (such as the 27 MHz RF signal in the previous example) are ascertained and/or established to achieve certain desired processing results. Further, each of the first preset power level and the second preset power level of the non-base pulsing RF signal is established independently for each pulsing state of the base pulsing RF signal. As such, they are independently ascertained and/or established for the plasma conditions that exist during the high state of the base RF signal (such as the 2 MHz RF signal in the previous example) and the low state of the base RF signal. Once these preset power levels are established for the non-base RF signal (e.g., during recipe formation), the non-base RF signal would proactively, responsive to a control signal from the master RF power supply or from an external synchronization control circuit, alternate between the first preset power level and the second preset power level during production (e.g., during substrate processing) as the base pulsing RF signal pulses between its high state and its low state. Another way of stating this is that the non-base pulsing RF signal response depends not only to the fact that the base RF signal pulses but also to the state (high or low) of the base RF signal.

In one or more embodiments, proactive response is used to optimize RF power instability during pulsing. As the term is employed herein, proactive or proactive response refers to the fact that compensation and/or pulsing of the RF signals is performed proactively instead of reactively. As discussed earlier, reactive response occurs when the match network or when the RF power supply associated with an RF signal detects that the plasma condition (such as plasma impedance, for example) has changed in the chamber due to the pulsing of one of the other RF signals. In the reactive response mode, after such detection occurs, the match network or the RF power supply responds to compensate for the detected plasma condition change. To elaborate, in the reactive response mode, the match network or the RF power supply responds only after detection is made.

In contrast, in the proactive response mode, the response of the match network or the RF power supply of the other RF signal is proactively initiated by a control signal without having to wait for the detection. For example, an external control circuit and/or processor and/or computer may proactively send a control signal to instruct the match network or an RF power supply to respond based on its knowledge of the pulsing behavior/timing of one or more of the other RF signals. Such control signal and response occur without having to wait for the detection of the pulse-related plasma condition change to occur. As another example, the RF generator for one of the pulsing RF signals may communicate with other RF generators to provide control signals to initiate the responses by the other RF generators. In this case, the RF generator that issues the control signal would act as the master RF generator, and other RF generators act as slave RF generators. The master RF generator issues control signals to its slave RF generators proactively instead of in response to the detection of plasma condition change.

By proactively controlling the response of the match network and/or the response of other RF generators, the RF power instability and/or the plasma perturbation due to pulsing is reduced in duration and/or in intensity. In this manner, power perturbation is reduced and plasma stability is enhanced.

The features and advantages of embodiments of the invention may be better understood with reference to the figures and discussions that follow.

Figure 2:
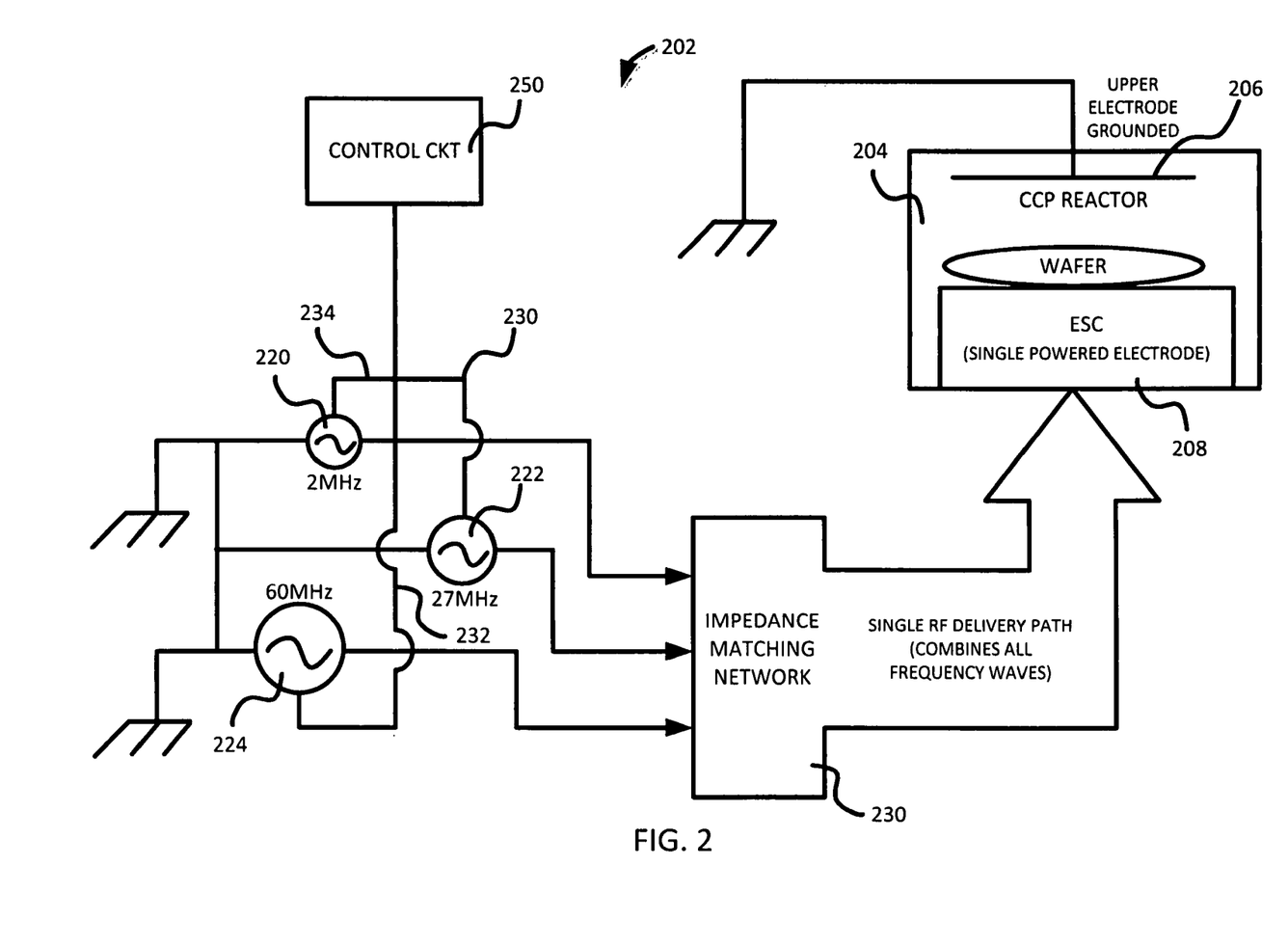
FIG. 2 shows, in accordance with an embodiment of the invention, a simplified capacitively coupled plasma processing system having a plasma processing chamber and configured for power level control of the various RF signal pulsing states.

FIG. 2 shows, in accordance with an embodiment of the invention, a simplified capacitively coupled plasma processing system 202 having a plasma processing chamber 204. Although a typical plasma processing system may have multiple chambers, only one chamber is shown for illustration purpose. Also omitted are other details well-known to those skilled in the art such as robot transfer arms, storage cassettes, gas supplies, etc.

In the example of FIG. 2, upper electrode 206 is grounded while lower electrode 208, representing the substrate holder or chuck, is supplied with three RF signals (2 MHz, 27 MHz, and 60 MHz) from three RF power supplies 220, 222, and 224 respectively through matching network 230. Although three RF signals and three RF power supplies are shown, lower electrode 208 may be supplied with as few as one or as many RF signals as desired. Further, although the RF frequencies of 2 MHz, 27 MHz, and 60 MHz are selected for illustration, different RF frequencies may be used if desired. As illustrated, plasma processing chamber 204 is configured for dielectric etching.

As is known by those skilled in the art, matching network 230 matches the impedance of the RF power sources 220, 222, and 224 with the impedance of the plasma load in plasma processing chamber to minimize the reflected power and to maximize power delivery. In accordance with an embodiment of the invention, the RF power sources 220, 222, and 224 are in communication such that if one of the RF power sources acts as an RF pulse master, that RF power source can send control signals proactively to other RF signals in order to proactively initiate the pulsing of these other RF signals.

For example, RF power source 220 (the 2 MHz RF power source) may act as the pulse master and send digital or analog control signals (which may be electrical or optical signals, for example) via conduits 230 and 232 to RF power sources 222 and 224 respectively to instruct RF power sources 222 and 224 to synchronize their pulsings with the master 2 MHz RF signal pulse (for example with the leading edge, the trailing edge, or any predetermined time in the 2 MHz RF pulse period) without having to wait for a detection of the plasma change condition in plasma processing chamber 204.

As another example, RF power source 222 (27 MHz RF power source) may act as the pulse master and send digital or analog control signals (which may be an electrical or an optical signal, for example) via conduits 234 and 232 to RF power sources 220 and 224 respectively to instruct RF power sources 220 and 224 to synchronize their pulsings with the master 27 MHz RF signal pulse (for example with the leading edge, the trailing edge, or any predetermined time in the MHz RF signal pulse period) without having to wait for a detection of the plasma change condition in plasma processing chamber 204.

Alternatively, a control circuit 250 may be used provide control signals to all three RF power sources 220, 222, and 224 as shown. In this case, none of the RF power sources would need to act as a master and all may receive control signals that proactively instruct the RF power sources to pulse from control circuit 250. By proactively controlling the pulsing of the various RF signals, RF power perturbation is minimized as will be shown in FIG. 3 below.

Figure 3:
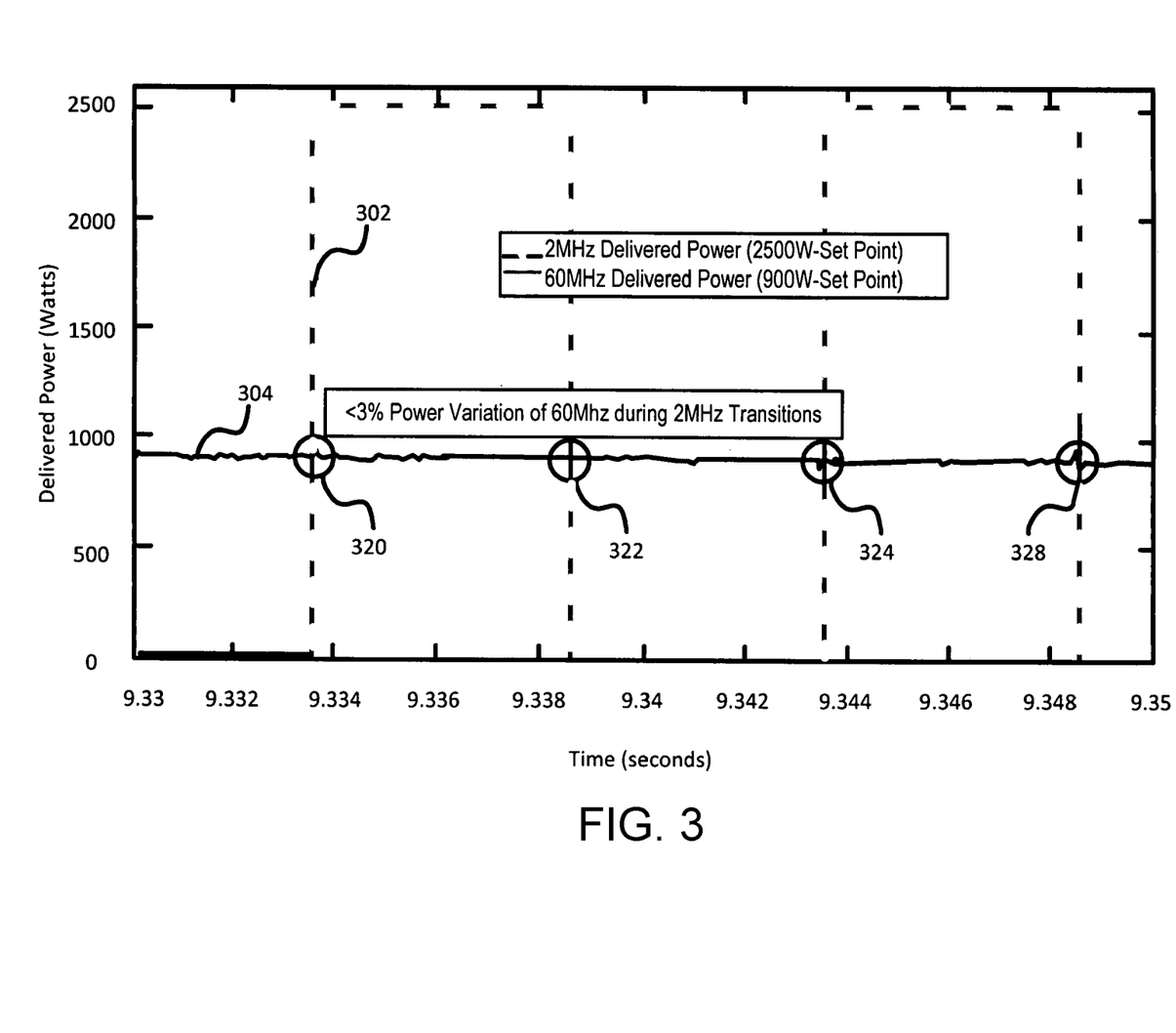
FIG. 3 shows a plot of delivered power versus time for two RF signals to illustrate the effect of proactively synchronizing the pulsing among the various RF signals.

FIG. 3 shows a plot of delivered power versus time for two RF signals: a 2 MHz RF signal 302 and a 60 MHz RF signal 304. The 2 MHz RF signal 302 pulses at 100 Hz with 50% duty cycle between 2,500 W and 0 W. For illustration clarity, the 60 MHz RF signal 304 pulses with its first preset power level set at 900 W for the high pulse duration of the 2 MHz RF signal and its second preset power level also set at 900 W for the low pulse duration of the 2 MHz RF signal in the example of FIG. 3. In the example of FIG. 3, both the 2 MHz and the 60 MHz RF power sources that generate these pulsed RF signals receive a control signal from a common control circuit (such as control circuit 250 of FIG. 2) and thus pulse proactively in a simultaneous manner without waiting for a detection of the plasma condition change. Alternatively, one of the RF power sources (e.g., either the 2 MHz RF power source or the 27 MHz RF power source) may act as a pulse master for the other RF power source and may issue a control signal proactively to instruct the other RF power source to pulse substantially simultaneously without waiting for a detection of a plasma condition change.

As can be seen in FIG. 3, power perturbation in the 60 MHz RF signal 304 is kept substantially lower (below 3% in the case of FIG. 3) for each high-to-low or low-to-high transition of the 2 MHz base pulsing RF signal 302. These are shown by reference numbers 320, 322, 324, and 328. There is substantially less RF power perturbation compared to the situation in FIG. 1 wherein the 60 MHz RF power source operates in the reactive mode (i.e., compensates responsive to a detection of a plasma condition change). This is because once the power level set points are determined for the non-base pulsing RF signals, the non-base pulsing RF signals can pulse between its two power set points without delay upon receiving a control signal, thereby contributing to a more stable RF power delivery.

In one or more embodiments, each of the first power level and the second power level of the non-base pulsing RF signals (i.e., higher RF frequency pulsing signals) may be dynamically ascertained from one or more measurable plasma processing chamber parameters (such as chuck bias or return RF current, for example). By "dynamic", it should be understood that this determination of the power levels may be done algorithmically during recipe formation or machine calibration, for example, or may be done on-the-fly during processing. The non-base pulsing RF signal's first power level (corresponding to the power level of the non-base pulsing RF signal while the base pulsing RF signal is in its high state) may be algorithmically ascertained automatically from sensor measurements of one or more plasma processing chamber parameters and computed for the high state of the base pulsing RF signal. Likewise, the non-base pulsing RF signal's second power level (corresponding to the power level of the non-base pulsing RF signal while the base pulsing RF signal is in its low state) may be algorithmically ascertained automatically from sensor measurements of one or more plasma processing chamber parameters and computed for the low state of the base pulsing RF signal.

In this case, the ability to dynamically determine and set the power levels of the non-base pulsing RF signals (i.e., the higher frequency pulsing RF signals), using a programmed computer for example, based on sensor measurements of one or more plasma processing chamber parameters during the high state and low state of the base RF pulsing signal in order to achieve a desired process parameter, represents an advantage since the power levels of the higher frequency pulsing RF power signals during the high state of the base pulsing RF signal and during the low state of the base pulsing RF signal are now separate control knobs for the process. Thereafter, the non-base pulsing RF signal simply transitions from the first predefined power level to the second predefined power level (and vice versa) upon receiving control signals from either the master RF power source or from an external controller (e.g., controller circuit 250 of FIG. 2).

Note that the first predefined power level and the second predefined power level are specific to each RF power supply. In other words, a 27 MHz power supply may have its own first predefined RF-power-supply-specific power level and second predefined RF-power-supply-specific power level while a 60 MHz RF power supply may have its own first predefined RF-power-supply-specific power level and second predefined RF-power-supply-specific power level that are different than those of the 27 MHz RF power supply.

In one or more embodiments, the power levels (i.e., the high pulsing power level and the low pulsing power level) of the base pulsing RF signal may also be determined dynamically, using a programmed computer for example, based on sensor measurements of one or more plasma processing chamber parameters (such as chuck bias) in order to achieve a desired process parameter (such as deposition rate). The ability to dynamically determine the power levels of the base pulsing RF signal, using a programmed computer for example, based on sensor measurements of one or more plasma processing chamber parameters in order to achieve a desired process parameter represents an advantage since the power levels of the base pulsing RF power signals are now control knobs for the process.

Figure 4:
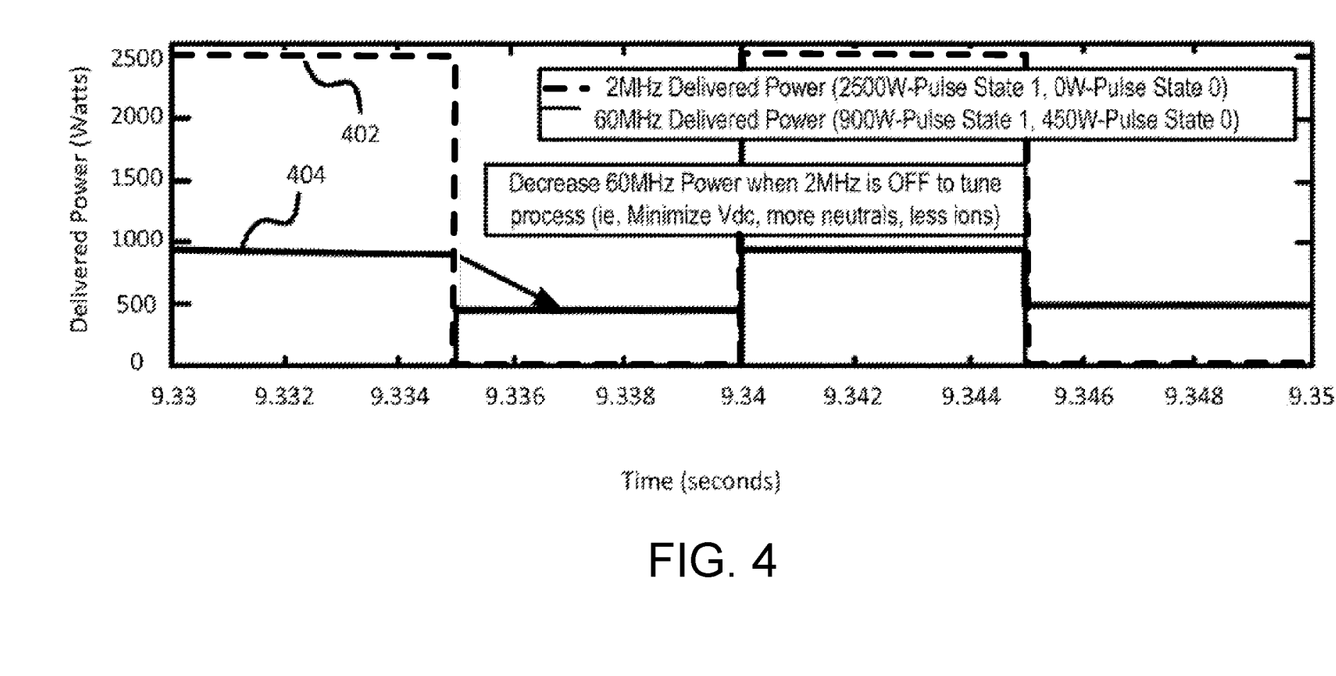
FIG. 4 shows, in accordance with an embodiment of the invention, the situation wherein the 60 MHz RF signal has its power levels adapted to the pulsing states of the 2 MHz RF signal.

FIG. 4 shows, in accordance with an embodiment of the invention, the situation wherein the 2 MHz RF signal 402 is pulsed at 100 Hz with 50% duty cycle between 2,500 W and 0 W. The 60 MHz RF signal 404 is synchronized in a proactive manner such that for the high state of the 2 MHz RF signal, the power level of the 60 MHz RF signal is at 900 W and during the low state of the 2 MHz RF signal, the power level of the 60 MHz RF signal is 450 W. Note that each of these two power levels of the 60 MHz RF signal is separately determined and set in view of the specific state (high or low) of the base RF pulsing signal (e.g., the 2 MHz RF signal) and is determined and set to achieve a desired process result (such as low polymer deposition, reduced wafer bias, etc.). Also, pulsing of the two RF signals of FIG. 4 occurs proactively, i.e., without waiting on the detection of a change in plasma condition or a detection of changes in one or more chamber parameters that reflect such plasma condition change due to base RF signal pulsing. As such, RF power perturbation and RF plasma instability are greatly reduced.

Figure 5:
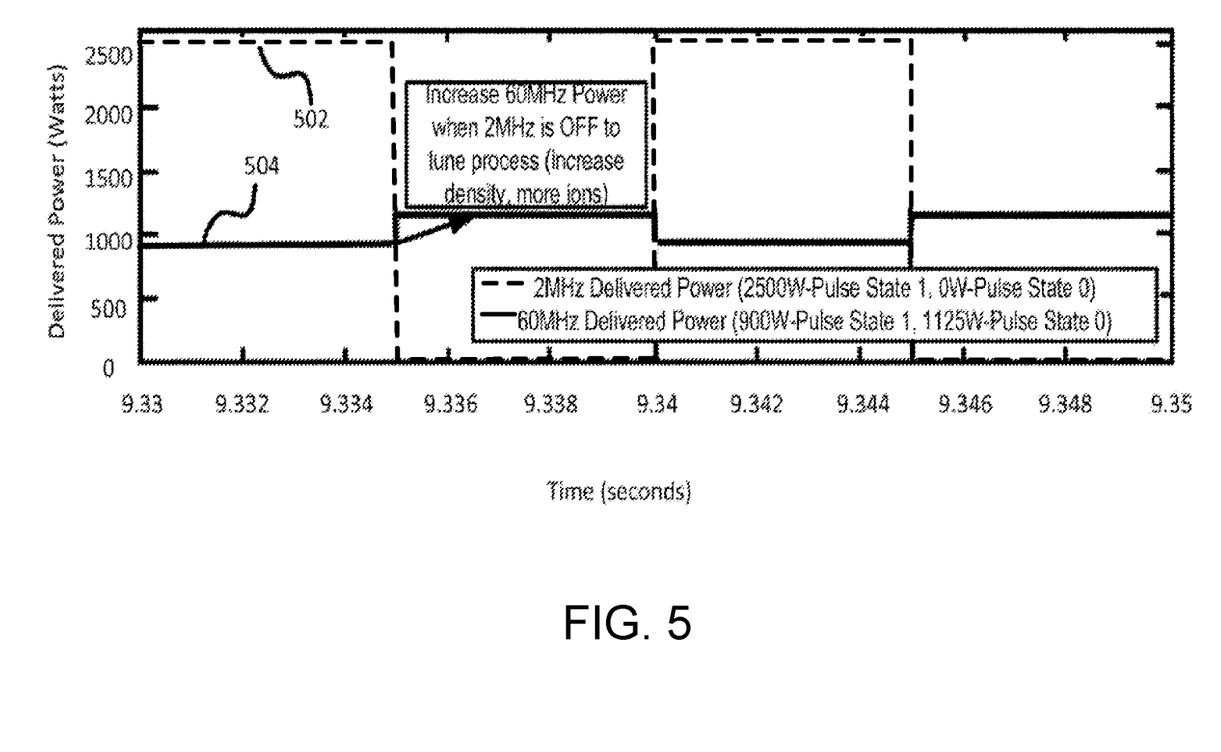
FIG. 5 shows, in accordance with another embodiment of the invention, the situation wherein the 60 MHz RF signal has its power levels adapted to the pulsing states of the 2 MHz RF signal.

FIG. 5 shows, in accordance with another embodiment of the invention, the situation wherein the 2 MHz RF signal 502 is pulsed at 100 Hz with 50% duty cycle between 2,500 W and 0 W. The 60 MHz RF signal 504 is synchronized in a proactive manner such that for the high state of the 2 MHz RF signal, the power level of the 60 MHz RF signal is at 900 W. During the low state of the 2 MHz RF signal, the power level of the 60 MHz RF signal is increased to 1,125 W. FIG. 4 and FIG. 5 illustrate that the power level of the non-base RF signal (i.e., the higher frequency pulsing RF signal) may be higher or lower after the base pulsing RF signal transitions from a high state to a low state. Again, note that each of these two power levels of the 60 MHz RF signal is determined and set in view of the specific state (high or low) of the base RF pulsing signal (e.g., the 2 MHz RF signal) and is determined and set to achieve a desired process result (such as low polymer deposition, reduced wafer bias, etc.). Also, pulsing of the two RF signals of FIG. 4 occurs proactively, i.e., without waiting on the detection of a change in plasma condition. As such, RF power perturbation and RF plasma instability are greatly reduced.

Figure 6:
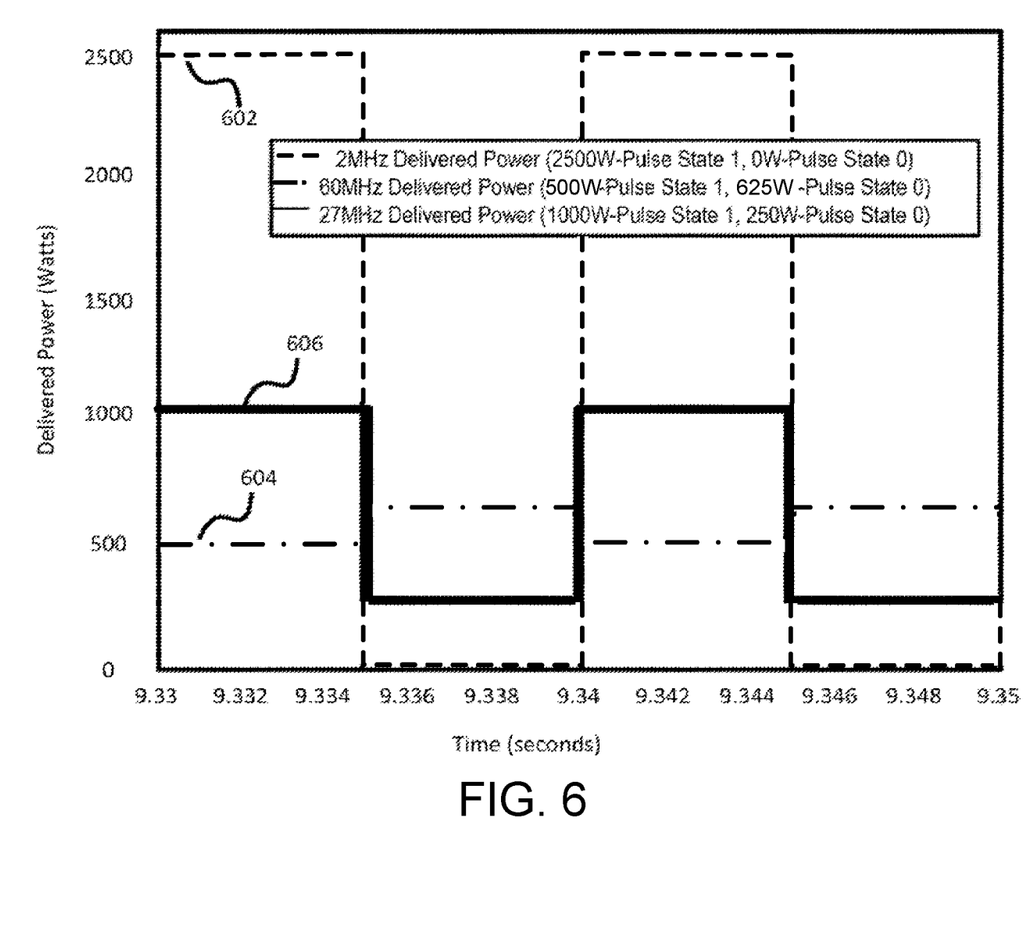
FIG. 6 shows, in accordance with another embodiment of the invention, the situation wherein the 27 MHz RF signal and the 60 MHz RF signal have their power levels adapted to the pulsing states of the 2 MHz RF signal.

FIG. 6 shows, in accordance with another embodiment of the invention, the situation wherein the 2 MHz RF signal 602 is pulsed at 100 Hz with 50% duty cycle between 2,500 W and 0 W. The 60 MHz RF signal 604 is synchronized in a proactive manner such that for the high state of the 2 MHz RF signal, the power level of the 60 MHz RF signal is at 500 W. During the low state of the 2 MHz RF signal, the power level of the 60 MHz RF signal is increased to 625 W. The 27 MHz RF signal 606 is synchronized in a proactive manner such that for the high state of the 2 MHz RF signal, the power level of the 27 MHz RF signal is at 1,000 W. During the low state of the 2 MHz RF signal, the power level of the 27 MHz RF signal is decreased to 250 W. Again, note that each of these two power levels of the 60 MHz RF signal and of the 27 MHz RF signal is determined and set in view of the specific state (high or low) of the base RF pulsing signal (e.g., the 2 MHz RF signal) and is determined and set to achieve a desired process result (such as low polymer deposition, reduced wafer bias, etc.).

In the case of FIG. 6, one of the RF power sources (such as either the 2 MHz RF power source, the 27 MHz RF power source, or the 60 MHz RF power source) may act as the master and may send control signals to the other RF power sources to synchronize pulsing proactively. Alternatively, an external control circuit can act as a master and may send control signals to all three RF power sources to synchronize pulsing proactively.

As mentioned, the RF power levels of the various RF signals may be tuned separately during the high state of the base pulsing RF signal and during the low state of the base pulsing RF signal to achieve a desired process result. As an example, it is believed that ion energy may be increased by increasing the RF power level of the 2 MHz RF signal. Increasing ion energy is beneficial may also result in unwanted excessive polymer deposition in some cases. Pulsing the 2 MHz RF signal at its optimum pulsing frequency and optimum high and low RF power levels may result in increased ion energy without suffering from undue polymer deposition.

Once the optimum RF power levels of the base pulsing RF signal are determined and/or set, the RF power levels of the non-base pulsing RF signals (i.e., the higher frequency pulsing RF signals) may be separately determined and set for the high state of the base pulsing RF signal and the low state of the base pulsing RF signal to further tune the process (such as to tune the plasma density since the power levels of the higher frequency RF signals tend to affect plasma density more). As such, these different RF power levels of different RF pulsing signals may be employed as separate control knobs for the process.

As mentioned, since the various pulsing RF signals are proactively synchronized, RF power perturbations are minimized. Even if an RF signal (such as the 60 MHz RF signal) is specified by the recipe to operate in a continuous waveform (CW) mode, it may be desirable, in one embodiment, to set such RF signal to proactively pulse at the same power level (such as 900 W) during both the high state of the base pulsing RF signal (such as the 2 MHz RF signal) since as shown in FIG. 3, such pulsing at the same power level reduces RF power perturbation compared to the reactive compensation approach.

In one or more embodiments, the RF power levels of the base pulsing RF signal and the non-base RF signals are set such that plasma is sustained during pulsing. In other words, the plasma is not extinguished during the low state of either the base pulsing RF signal and/or the low state of the non-base pulsing RF signal. Keeping the plasma ignited allows process control to be more efficiently exerted by the process knobs of separate RF power levels (as mentioned earlier) and also minimizes plasma disturbance since plasma striking and/or ignition (which would have been necessary if the plasma is allowed to extinguish) is not as well-controlled a process as a continuous plasma. As such, repeatability and uniformity is enhanced.

In one or more embodiments, bimodal auto-frequency tuning techniques and apparatus therefor are disclosed. In a bimodal auto-frequency tuning approach, the tuned frequency of the non-base RF signal is proactively changed as the base RF signal pulses from one state to another state to ensure efficient and stable power delivery for every state of the base RF signal.

To elaborate, modern RF power supplies are capable of tuning its delivered RF frequency to improve power delivery (e.g., by changing the RF frequency delivered to the load). As an example, a 60 MHz RF generator may be capable of changing its tuned RF frequency by, for example, 5 to 10% (i.e., changing the RF frequency delivered to the load by 60 MHz+/−5% to 10%).

However, such frequency change has been performed, so far, as an after-the-fact response of the RF generator when its sensors detect a change in the amount of RF power delivered to the load. Such detection often depends on a measurement of, for example, the ratio of the reflected power to the forward power (also known as gamma). When the RF generator detects a condition that is characteristic of inefficient power delivery (based on some preset gamma threshold, for example), the RF generator would, in a frequency tuning scheme, change its tuned RF frequency in order to more efficiently deliver power to the load.

However, the after-the-fact nature of the current frequency tuning scheme often means that there is a lag in the response when changes occur to the plasma impedance or the plasma load. During this lag time, under certain conditions such as when the base RF signal pulses from one state to another state, the non-base RF generator may be highly inefficient or may be unable to deliver power at the required power set points (as specified by the recipe) until the non-base RF generator changes its tuned frequency sufficiently to adapt to the changed plasma load.

In accordance with one or more embodiments of the invention, the tuned frequency of the non-base RF signals are ascertained in advance for every pulse state (e.g., high or low) of the base RF signal. Consider the situation, for example, when the 2 MHz base RF signal pulses at about 1 kHz with a 50% duty cycle. For example, during the learning phase, it may be ascertained that when the 2 MHz base RF signal is in its low pulse state (i.e., after pulsing low), power delivery by the 60 MHz RF generator is efficient when the 60 MHz RF generator actually delivers its RF power using a 61 MHz tuned frequency. Further, it may be ascertained, in another example, in the learning phase that when the 2 MHz RF signal is in its high pulse state (e.g., after pulsing high), the 60 MHz RF generator is efficient when the 60 MHz RF generator actually delivers its RF power using a 59 MHz tuned frequency.

In one or more embodiments, during production, the 60 MHz RF generator (i.e., the non-base RF generator in this example) would proactively change its tuned frequency at the same time as the base RF signal pulses from one state to another state. The frequency change is said to be proactive since the change in the tuned frequency by the non-base RF generator is not made based on an after-the-fact detection of a change in the plasma condition or a change in the impedance seen by the 60 MHz RF generator due to the pulsing of the base RF signal.

Rather, the change in the tuned RF frequency by the non-base RF generator is synchronized such that the change occurs at an optimal time to ensure adequate and/or efficient power delivery as the base RF signal pulses from one state to another state. For example, the 60 MHz RF generator may change its RF tuned frequency proactively based on a coordination signal (which may be issued by the 2 MHz RF generator or any one of the RF generators or by a separate control circuit that coordinates the RF generators) instead of waiting for a detection of a change in the plasma condition or a change in the impedance seen by the 60 MHz RF generator due to the pulsing of the base RF signal. Generally speaking, the non-base RF generator may change its tuned frequency at the same time or even before the base RF signal pulses from one pulsing state to another pulsing state.

Figure 7:
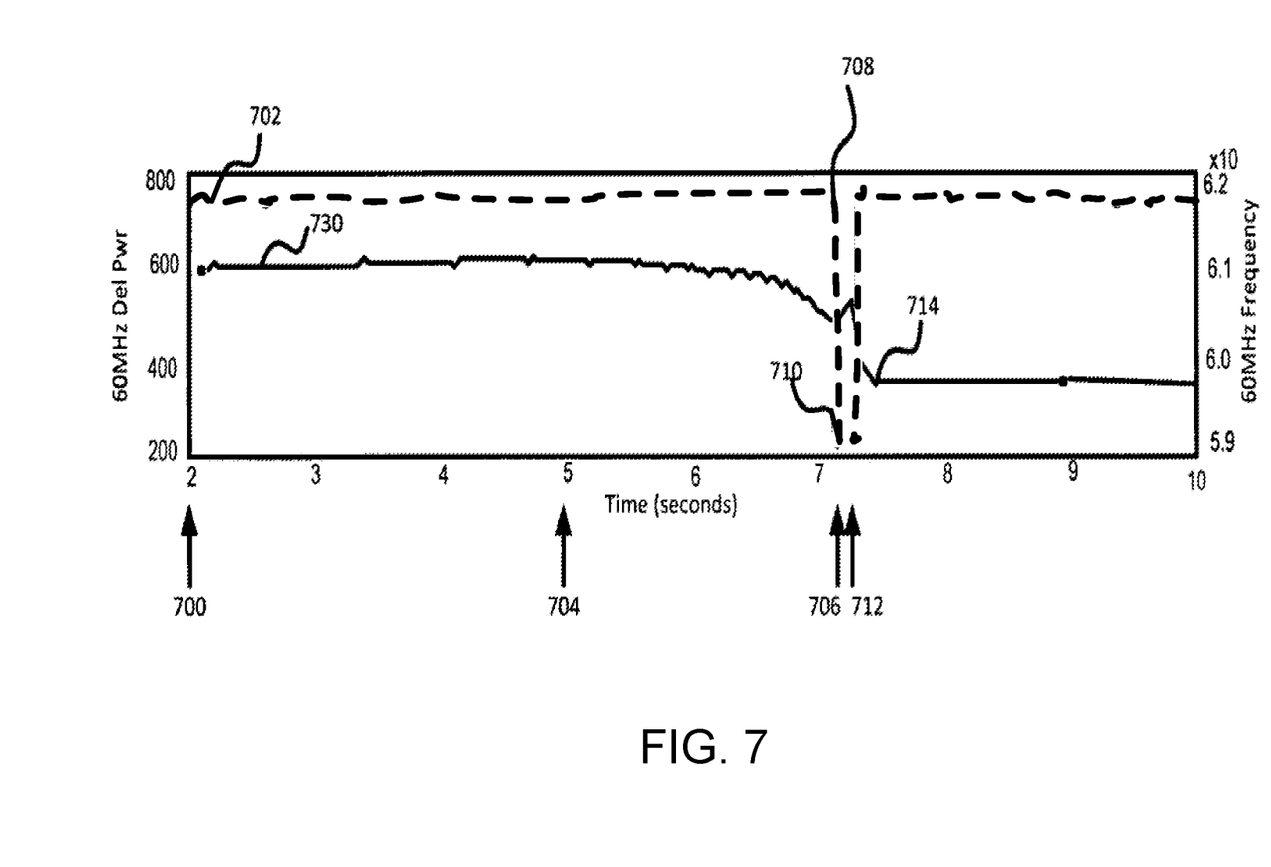
FIG. 7 shows a proof of concept plot, illustrating the fact that under certain conditions, the non-base RF generator is unable to deliver RF power at the required power set point.

FIG. 7 shows a proof of concept plot, illustrating the fact that under certain conditions, the non-base RF generator is unable to deliver RF power at the required power set point. This is the situation in the prior art, for example. In the example of FIG. 7, the base 2 MHz RF generator has a power set point of 9 kW (not shown in FIG. 7), and the 60 MHz RF generator has a power set point of 750 W. These are the desired power levels for the respective RF generators. Further, the base 2 MHz RF signal ramps for 5 seconds from a high state to a low state (from 2.2 seconds to 7.2 seconds) in the example of FIG. 7.

In FIG. 7, the left vertical axis represents the amount of power delivered by the 60 MHz RF generator while the right vertical axis represents the tuned frequency of the 60 MHz RF generator. Both vertical axes are plotted against the horizontal time axis. Line 702 represents the amount of RF power delivered. Line 730 represents the tuned frequency of the 60 MHz RF generator.

At point 700, the 2 MHz RF generator is at the high pulse state. At this point, the 60 MHz RF generator delivers its power efficiently at a tuned RF frequency of approximately 61 MHz (line 730 at time t=2 seconds).

At time 2.2 seconds, the 2 MHz base RF signal begins to ramp low, reaching its low state at 7.2 seconds. As can be seen by the RF power line 702, the 60 MHz RF generator senses the change in the plasma load and attempts to maintain its power set point of 750 W. At some point in time, starting at about 5 seconds (point 704), the 60 MHz RF generator begins to change its tuned frequency downward in order to increase the RF power delivery efficiency in response to the detected change in the plasma load (which is caused by the 2 MHz base signal ramping to the low state).

At time 7.2 seconds (reference number 706 on the horizontal time axis), the 2 MHz base RF signal is at its low state. As can be seen in FIG. 7, the amount of RF power delivered by the MHz RF generator temporarily drops to about 220 W from point 708 to point 710. This amount of RF power delivered by the 60 MHz RF generator is substantially below the 750 W power set point for the 60 MHz RF generator. This represents an undesirable situation.

From point 706 to point 712, the 60 MHz RF generator hunts for the tuned RF frequency that would enable the delivery of 60 MHz RF power at the required power set point of 750 W with the 2 MHz RF signal at its low pulse state. At point 714, the 60 MHz RF generator settles to a tuned RF frequency of about 59.75 MHz. At this lower tuned RF frequency, the 60 MHz generator is able to deliver RF power at its set point of 750 W again.

The proof of concept plot of FIG. 7 illustrates that for every pulse state of the 2 MHz base signal, there is an optimal tuned RF frequency for the 60 MHz RF generator. Further, if the 60 MHz generator changes its tuned RF frequency in an after-the-fact manner (i.e., after detecting a change in the plasma load due to the pulsing of the 2 MHz base RF signal as per FIG. 7), there may exist situations where the power set points and the RF frequencies are such that the 60 MHz RF generator would be unable to meet its required power set point. This is shown in FIG. 7 between points 706 and 712.

Figure 8:
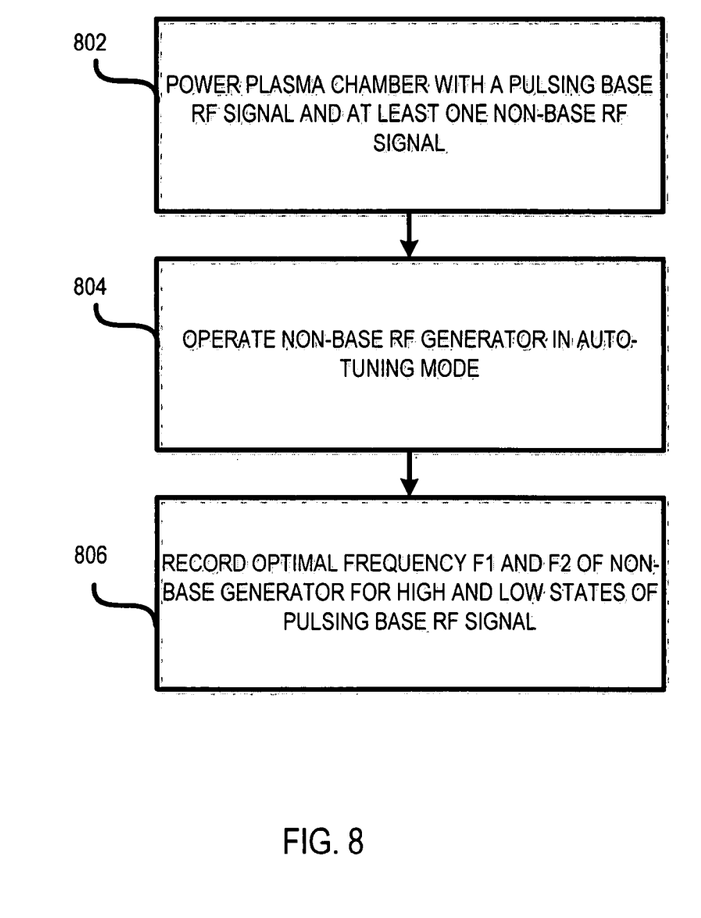
FIG. 8 shows, in accordance with an embodiment of the invention, a method for learning the optimal tuned RF frequencies for the non-base RF generator while the base RF generator pulses.

FIG. 8 shows, in accordance with an embodiment of the invention, a method for learning the optimal tuned RF frequencies for the non-base RF generator while the base RF generator pulses. In step 802, the plasma chamber is powered with a pulsing base RF signal and at least one non-base RF signal. In step 804, the non-base RF generator(s) is/are operated in the auto-tuning mode to enable the non-base RF generator to seek its optimal RF frequencies (f1 and f2) for the high state and the low state respectively of the base RF signal. In this auto-tuning mode, the non-base RF generator is allowed to seek its own tuned RF frequency during each of the states of the base RF signal. These optimal RF frequencies (for the non-base RF signal) for each of the states of the base RF signal serve as predefined RF frequencies, and the non-base RF generator proactively switches from one predefined RF frequency to another predefined RF frequency as the base RF signal pulses.

As the term is employed herein, optimal RF frequency for the non-base RF generator refers to the RF frequency at which the non-base RF generator can deliver its power acceptably or efficiently (according to some predefined criteria) and/or can meet its power delivery set point. As discussed herein, there are at least two optimal RF frequencies for the non-base generator. These two optimal RF frequencies correspond to the two switching states of the base RF signal.

Note that the first predefined RF frequency and the second predefined RF frequency employed during production are specific to each RF power supply. In other words, a 27 MHz power supply may have its own first predefined RF-power-supply-specific RF frequency and second predefined RF-power-supply-specific RF frequency while a 60 MHz RF power supply may have its own first predefined RF-power-supply-specific RF frequency and second predefined RF-power-supply-specific RF frequency that are different than those of the 27 MHz RF power supply.

In one or more embodiments, all other conditions of the chamber are preferably arranged such that they mimic as closely as possible the conditions in production. In another embodiment, the frequency of the non-base RF generator may be manually changed to ascertain (e.g., by measuring gamma) the optimal frequencies f1 and f2 for the high state and the low state respectively of the base RF signal.

In step 806, these optimal non-base RF generator frequencies for the high state and low state of the base RF signal are recorded and/or stored for use during production (i.e., production of substrates after the optimal non-base RF generator frequencies were learned in the learning phase). During production, the non-base RF generator proactively switches between optimal RF frequency f1 and optimal RF frequency f2 as the base RF signal pulses instead of waiting for the detection of a change in the plasma impedance or in the gamma.

Figure 9:
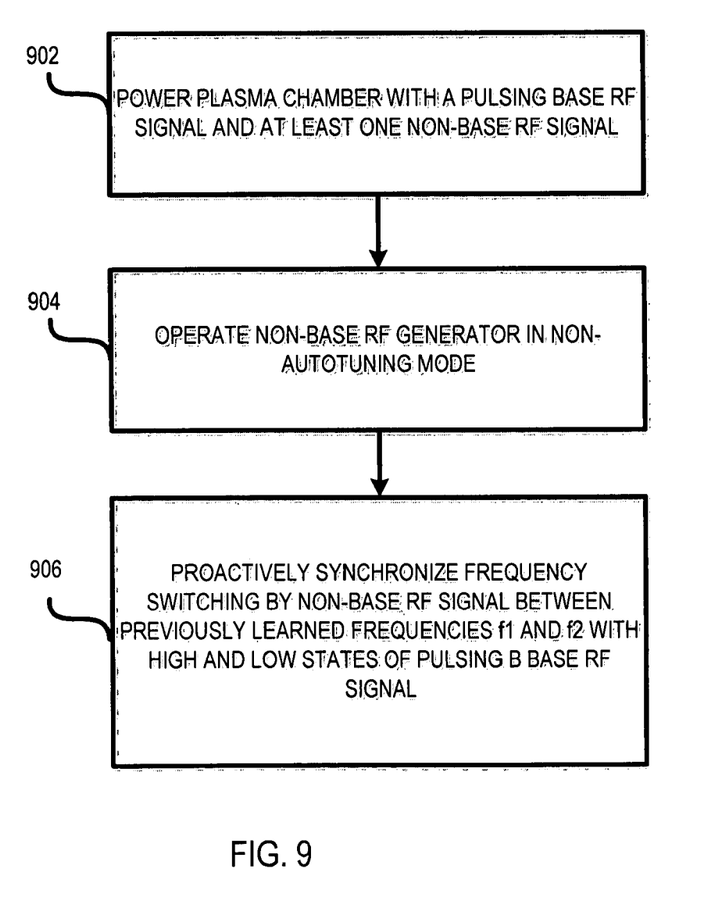
FIG. 9 shows, in accordance with an embodiment of the invention, a method for delivering optimal RF power to the plasma load in a plasma chamber while the plasma chamber is provided with a pulsing base RF signal and at least one non-base RF signal.

FIG. 9 shows, in accordance with an embodiment of the invention, a method for delivering optimal RF power to the plasma load in a plasma chamber while the plasma chamber is provided with a pulsing base RF signal and at least one non-base RF signal. In step 902, the plasma chamber is powered with a pulsing base RF signal and at least one non-base RF signal. In step 904, the non-base RF generator (s) is/are operated in the non-autotuning mode. In step 906, the frequency switching of the non-base RF signal is proactively synchronized with the pulsing of the base RF generator. This proactive synchronization enables the non-base RF generator to switch its tuned frequency between previously learned optimal tuned frequency f1 and previously learned optimal tuned frequency f2 as the base RF signal pulses between its high state and its low state. The switching of the tuned frequency of the non-base RF generator is said to be proactive during production since the switching is performed in response to a synchronization signal and is independent of changed plasma load condition sensing (i.e., detection of changes in chamber parameter/parameters that reflects/reflect such changed plasma load condition due to the pulsing of the base RF signal).

The synchronization signal may be issued by the base RF generator, by any RF generator of the multiple RF generators, or by an external synchronization circuit or computer, for example. In an embodiment, the non-base RF generator proactively switches from one previously learned optimal RF frequency f1 to another previously learned optimal RF frequency f2 at the same time as the base RF signal switches from one state to another state.

For example, if the previously learned optimal RF frequency f1 for the non-base RF generator is ascertained to be efficient for the high state of the base RF signal and the previously learned optimal RF frequency f2 for the non-base RF generator is ascertained to be efficient for the low state of the base RF signal, the non-base RF generator may switch, responsive to a synchronization signal, to previously learned optimal RF frequency f1 as the base RF generator pulses to the high state. Further, the non-base RF generator may switch, responsive to a synchronization signal, to previously learned optimal RF frequency f2 as the base RF generator pulses to the low state.

In another embodiment, the non-base RF generator may proactively switch from one previously learned optimal RF frequency f1 to another previously learned optimal RF frequency f2 even slightly before the base RF signal switches from one state to another state.

In another embodiment, the non-base RF generator may proactively switch from one previously learned optimal RF frequency f1 to another previously learned optimal RF frequency f2 even slightly after the base RF signal switches from one state to another state.

In one or more embodiments, the proactive non-base RF signal frequency switching (e.g., between previously learned RF frequency f1 and previously learned RF frequency f2) of the non-base RF generator may be combined with the proactive power level setting of the non-base RF generator in order to improve RF power delivery efficiency and stability as the base RF signal pulses. In one or more embodiments, the proactive frequency switching of the non-base RF signal and/or the proactive power level switching of the non-base RF generator may be synchronized with the pulsing of the base RF signal. If multiple non-base RF signals are involved, the frequencies and/or power levels of these non-base RF signals may be proactively switched as the base RF signal pulses using a similar arrangement as that discussed for the single non-base RF signal situation.

As can be appreciated from the foregoing, embodiments of the invention improve RF power delivery stability and efficiency as the base RF signal pulses between its high state and its low state. By proactively changing the RF power levels of the non-base RF generator or non-base RF generators (if multiple non-base RF generators are involved), power delivery stability is improved while the base RF signal pulses between its high state and its low state. By proactively switching between previously learned optimal RF frequencies for the non-base RF generator or non-base RF generators (if multiple non-base RF generators are involved), power delivery efficiency is improved or power delivery is rendered possible for every pulse state of the base RF signal and for the time durations surrounding the transition from high-to-low and low-to-high of the base RF By providing these additional control knobs, the process recipe window may be opened to accommodate more stringent process requirements, leading improved processing and yield of high density/high performance devices.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

The invention claimed is:

1. A system comprising:
a base radio frequency (RF) generator including a pulse master configured to generate a control signal, wherein the RF generator is configured to generate a base RF signal, wherein the base RF signal pulses between a first base power level and a second base power level; and
a non-base RF generator coupled to the base RF generator, wherein the non-base RF generator is configured to receive the control signal from the pulse master of the base RF generator, wherein the non-base RF generator is configured to generate a non-base RF signal that pulses between a first non-base power level and a second non-base power level in synchronization with the control signal received from the pulse master of the base RF generator,
wherein the base RF generator is configured to supply the base RF signal to an impedance matching circuit coupled to an electrode of a plasma chamber and the non-base RF generator is configured to supply the non-base RF signal to the impedance matching circuit.

2. The system of claim 1, wherein the base RF generator is configured to send the control signal to the non-base RF generator without waiting for a detection in a change in plasma condition.

3. The system of claim 2, wherein in response to the control signal, the non-base RF generator is configured to transition the non-base RF signal from the first non-base power level to the second non-base power level within a predetermined time from a transition of the base RF signal from the first base power level to the second base power level.

4. The system of claim 3, wherein the predetermined time occurs at a time of the transition of the base RF signal from the first base power level to the second base power level.

5. The system of claim 2, wherein in response to the control signal, the non-base RF generator is configured to transition the non-base RF signal from the second non-base power level to the first non-base power level within a predetermined time from a transition of the base RF signal from the second base power level to the first base power level.

6. The system of claim 5, wherein the predetermined time occurs at a time of the transition of the base RF signal from the second base power level to the first base power level.

7. The system of claim 1, wherein the first and second non-base power levels are learned based on measurements received from a sensor.

\* \* \* \* \*